US011336278B2

(12) United States Patent
Hayakawa

(10) Patent No.: US 11,336,278 B2
(45) Date of Patent: May 17, 2022

(54) SWITCHING CIRCUIT AND HIGH FREQUENCY MODULE

(71) Applicant: Murata Manufacturing Co., Ltd., Nagaokakyo (JP)

(72) Inventor: Masashi Hayakawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 511 days.

(21) Appl. No.: 15/648,752

(22) Filed: Jul. 13, 2017

(65) Prior Publication Data

US 2017/0310319 A1    Oct. 26, 2017

Related U.S. Application Data

(63) Continuation of application No. PCT/JP2016/050457, filed on Jan. 8, 2016.

(30) Foreign Application Priority Data

Feb. 6, 2015 (JP) ............................. JP2015-021775

(51) Int. Cl.
*H03K 17/56* (2006.01)
*H04B 1/00* (2006.01)
(Continued)

(52) U.S. Cl.
CPC ....... *H03K 17/56* (2013.01); *H01L 23/49844* (2013.01); *H01L 23/66* (2013.01);
(Continued)

(58) Field of Classification Search
CPC .... H03K 17/56; H03K 17/161; H03K 17/693; H01L 23/49822; H01L 23/49844;
(Continued)

(56) References Cited

U.S. PATENT DOCUMENTS

| | | | |
|---|---|---|---|
| 2002/0008672 A1* | 1/2002 | Gothard ................ | H01Q 1/246 |
| | | | 343/893 |
| 2003/0020563 A1* | 1/2003 | Hieda ..................... | H03H 11/18 |
| | | | 333/164 |

(Continued)

FOREIGN PATENT DOCUMENTS

| | | |
|---|---|---|
| CN | 101485085 A | 7/2009 |
| JP | 2006-310968 A | 11/2006 |

(Continued)

OTHER PUBLICATIONS

Official Communication issued in International Patent Application No. PCT/JP2016/050457, dated Mar. 22, 2016.

*Primary Examiner* — Jianxun Yang
(74) *Attorney, Agent, or Firm* — Keating & Bennett, LLP

(57) ABSTRACT

In a switching circuit, an inductance of an inductor of a shunt circuit is such that off capacitance of a second switching device that is in the off state when a first switching device is in the on state is used to define, in the shunt circuit, a series resonance circuit with a desired resonant frequency. Therefore, the frequency of an unnecessary signal to be attenuated is set to the resonant frequency of the series resonance circuit. Thus, the switching circuit achieves improved isolation characteristics with other circuits by attenuating the unnecessary signal.

15 Claims, 6 Drawing Sheets

(51) Int. Cl.
*H04B 1/52* (2015.01)
*H03K 17/693* (2006.01)
*H03K 17/00* (2006.01)
*H03K 17/041* (2006.01)
*H01L 23/498* (2006.01)
*H01L 23/66* (2006.01)
*H04B 1/40* (2015.01)
*H01L 29/72* (2006.01)
*H01L 29/772* (2006.01)
*H01L 29/868* (2006.01)

(52) U.S. Cl.
CPC ......... *H03K 17/002* (2013.01); *H03K 17/007* (2013.01); *H03K 17/04106* (2013.01); *H03K 17/693* (2013.01); *H04B 1/00* (2013.01); *H04B 1/006* (2013.01); *H04B 1/0064* (2013.01); *H04B 1/40* (2013.01); *H04B 1/52* (2013.01); *H01L 23/49822* (2013.01); *H01L 29/72* (2013.01); *H01L 29/772* (2013.01); *H01L 29/7722* (2013.01); *H01L 29/868* (2013.01); *H01L 2223/6677* (2013.01); *H01L 2223/6688* (2013.01); *H01L 2224/16225* (2013.01); *H01L 2924/15192* (2013.01); *H01L 2924/19105* (2013.01)

(58) Field of Classification Search
CPC ....... H01L 23/66; H01L 29/72; H01L 29/772; H01L 29/7722; H01L 29/868; H04B 1/40; H03H 11/18; H03H 11/20
See application file for complete search history.

(56) References Cited

U.S. PATENT DOCUMENTS

| 2007/0030101 | A1 | 2/2007 | Mizutani | |
| 2008/0265977 | A1* | 10/2008 | Gu | H01P 1/15 327/403 |
| 2009/0295501 | A1 | 12/2009 | Hayashi et al. | |
| 2014/0009213 | A1* | 1/2014 | Sprinkle | H03K 17/161 327/427 |
| 2014/0334362 | A1* | 11/2014 | Granger-Jones | H04L 5/08 370/297 |

FOREIGN PATENT DOCUMENTS

| JP | 2007-049309 A | 2/2007 |
| JP | 2007-251508 A | 9/2007 |

\* cited by examiner

SWITCHING CIRCUIT AND HIGH FREQUENCY MODULE

CROSS REFERENCE TO RELATED APPLICATIONS

This application claims the benefit of priority to Japanese Patent Application No. 2015-021775 filed on Feb. 6, 2015 and is a Continuation application of PCT Application No. PCT/JP2016/050457 filed on Jan. 8, 2016. The entire contents of each application are hereby incorporated herein by reference.

BACKGROUND OF THE INVENTION

1. Field of the Invention

The present invention relates to a switching circuit including a first switching device connected in series to a signal path and a second switching device shunt-connected to the signal path, and also relates to a high frequency module including the switching circuit.

2. Description of the Related Art

A switching circuit 500 of the related art in FIG. 8 includes a first switching device 504 whose source and drain are connected in series to a signal path 503 coupling an input terminal 501 to an output terminal 502, and a second switching device 505 whose source and drain are shunt-connected between the signal path 503 and a ground GND. When a high frequency signal is to be passed through the signal path 503 between the input-output terminals 501 and 502, the first switching device 504 is switched to the on state by receiving a control signal at the gate from a control terminal 506 through an input resistor R, and the second switching device 505 is switched to the off state by receiving a control signal from a control terminal 507 through an input resistor R.

When a high frequency signal is not to be passed through the signal path 503 between the input-output terminals 501 and 502, the first switching device 504 is switched to the off state by receiving a control signal from the control terminal 506, and the second switching device 505 is switched to the on state by receiving a control signal from the control terminal 507. Therefore, a leak signal having passed through the first switching device 504 that is in the off state is directed to the ground through second switching device 505, achieving improvement of isolation characteristics between the input-output terminals 501 and 502 which are obtained when the signal path 503 is closed by using the first switching device 504.

Recently, as portable communication terminals, such as a cellular phone and a personal digital assistant, and communication devices such as a wireless LAN terminal, there have been provided communication devices that include multiple communication systems in which communication using different respective communication standards, such as the GSM (Global System for Mobile communications: registered trademark) standard, the W-CDMA (Wideband Code Division Multiple Access) standard, the LTE (Long Term Evolution) standard, and the Bluetooth (registered trademark) standard, is performed and that support communication by using multiple communication standards (multi-mode). In the communication devices that support the multi-mode in such a manner as to include multiple communication systems, given frequency bands are allocated to the respective communication systems, and the multiple frequency bands (multi-bands) are used to perform communication. As a communication device that thus supports the multi-mode, there has been also provided a communication device that also includes a communication system for receiving a signal from a GPS (Global Positioning System) satellite in addition to the communication systems that perform communication using the respective communication standards described above.

In a communication device that supports the multi-mode and multi-bands, the quality and the reliability of communication, and the communication rate have been improved through use of multiple antennas. For example, in a diversity scheme, reception signals in the same frequency band are received by using multiple antennas. The strengths and the like of received reception signals in the same frequency band are compared with one another. Then, communication is performed by using an antenna in the best reception condition, and/or reception signals in the same frequency band are combined with one another so that noise included in the reception signals is removed. Thus, the quality and the reliability of communication has been improved.

For example, in a carrier aggregation scheme, multiple communication systems to which frequency bands different from one another are allocated are used to perform communication. That is, signals in different frequency bands are used at the same time. Thus, the frequency band used in transmission or reception is widened, and the communication rate and the channel capacity have been improved.

Thus, recently, due to further reduction in size of a communication device, a communication device employing a diversity scheme, a carrier aggregation scheme, or the like has difficulty of obtaining sufficient isolation between the communication systems. Therefore, in the case where the switching circuit 500 coupled to given communication systems receives signals of different frequencies at the same time, if high frequency signals received at the same time have a rough relationship of multiplication, a harmonic which is twice or three times a signal on the low frequency side may be in a frequency band close to the frequency band of a signal on the high frequency side. In this case, there arises a problem in that both of an unnecessary harmonic and a necessary reception signal pass through the first switching device 504 that is in the on state and in that desired transmission characteristics fail to be obtained in a circuit subsequent to the switching circuit 500. In this case, if the unnecessary harmonic fails to be removed by using a filter or the like coupled to the switching circuit 500, the given communication systems coupled to the switching circuit 500 may have an adverse effect.

SUMMARY OF THE INVENTION

Preferred embodiments of the present invention provide switching circuits that achieve improvement of isolation characteristics with another circuit by effectively attenuating an unnecessary signal such as a harmonic, and high frequency modules including such switching circuits.

A switching circuit according to a preferred embodiment of the present invention includes a first terminal, a plurality of second terminals, first switching devices, and shunt circuits. Each of the first switching devices is connected in series to a corresponding one of signal paths coupling the first terminal to a corresponding one of the plurality of second terminals. Each of the shunt circuits is disposed between a corresponding one of the plurality of second terminals and a ground terminal. Each of the shunt circuits includes a second switching device and an inductor. The second switching device and the inductor are coupled to each other in series.

In a preferred embodiment of the present invention with such a structure, when a signal is to be passed between the first terminal and a second terminal, the first switching device is switched to the on state, and the second switching device is switched to the off state. When the first switching device is in the on state, the off capacitance of the second switching device that is in the off state and the inductor coupled in series to the off capacitance define an LC series resonance circuit. The inductance of the inductor is designed so that the resonant frequency of the LC series resonance circuit matches the frequency of a signal to be attenuated. Thus, a desired attenuation pole is able to be provided in the bandpass characteristics between the first and second terminals. Accordingly, the isolation characteristics in the switching circuit are improved.

The inductors of the shunt circuits may have inductances different from one another.

Thus, LC series resonance circuits to which resonant frequencies different from one another are set are provided in the shunt circuits. Accordingly, the frequency band of a signal to be attenuated may be set for each of the signal paths.

The switching circuit may further include a third terminal and third switching devices. Each of the third switching devices is connected in series to a corresponding one of signal paths coupling the third terminal to a corresponding one of the plurality of second terminals.

Thus, when the inductances of the inductors of the shunt circuits are adequately set, desired attenuation poles may be provided in both of the bandpass characteristics of the signal paths coupling the first terminal to the second terminals and the bandpass characteristics of the signal paths coupling the third terminal to the second terminals.

Each of the shunt circuits may define a series resonance circuit by including a capacitance and the inductor. The capacitance is produced when the second switching device is in an off state. The inductor of the series resonance circuit may have an inductance value such that a resonant frequency of the series resonance circuit is equal or substantially equal to a frequency of a signal passing through one of the signal paths. The one of the signal paths is coupled to a different shunt circuit of the shunt circuits. The different shunt circuit is a shunt circuit in which the second switching device is in an on state.

Thus, even if, to a shunt circuit in which a series resonance circuit is provided, a signal passing through a signal path coupled to a different shunt circuit is propagated, the propagated signal may escape to the ground terminal through the series resonance circuit, achieving improvement of isolation characteristics between the second terminals.

A high frequency module according to a preferred embodiment of the present invention may include a multi-layer substrate including a first principal surface on which the first, second, and third switching devices are mounted.

Such a configuration may provide a high frequency module having a practical configuration including a multi-layer substrate including a switching circuit that achieves improvement of isolation characteristics in the switching circuit by effectively attenuating an unnecessary signal such as a harmonic.

In the high frequency module, the inductor may be a chip component mounted on the first principal surface of the multi-layer substrate or a wiring electrode provided in the multi-layer substrate.

Such a configuration provides a small-size high frequency module because inductors or the like in the switching circuit may be mounted on or in the multi-layer substrate.

Preferred embodiments of the present invention provide switching circuits that achieve improvement of isolation characteristics by attenuating an unnecessary signal.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
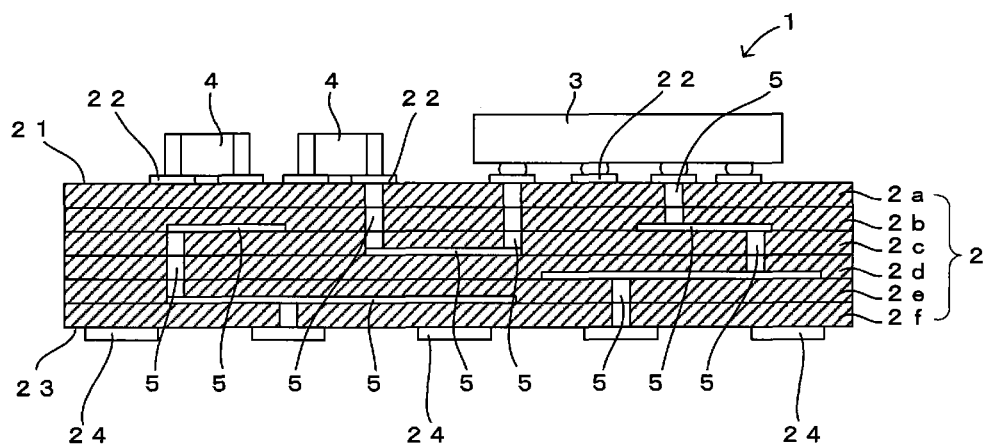
FIG. 1 is a sectional view of a high frequency module according to a first preferred embodiment of the present invention.
Figure 2:
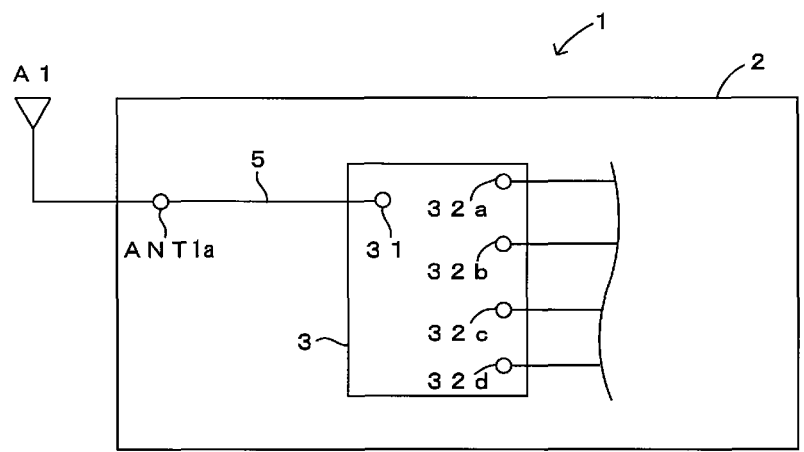
FIG. 2 is a diagram illustrating a high frequency circuit included in the high frequency module in FIG. 1.
Figure 3:
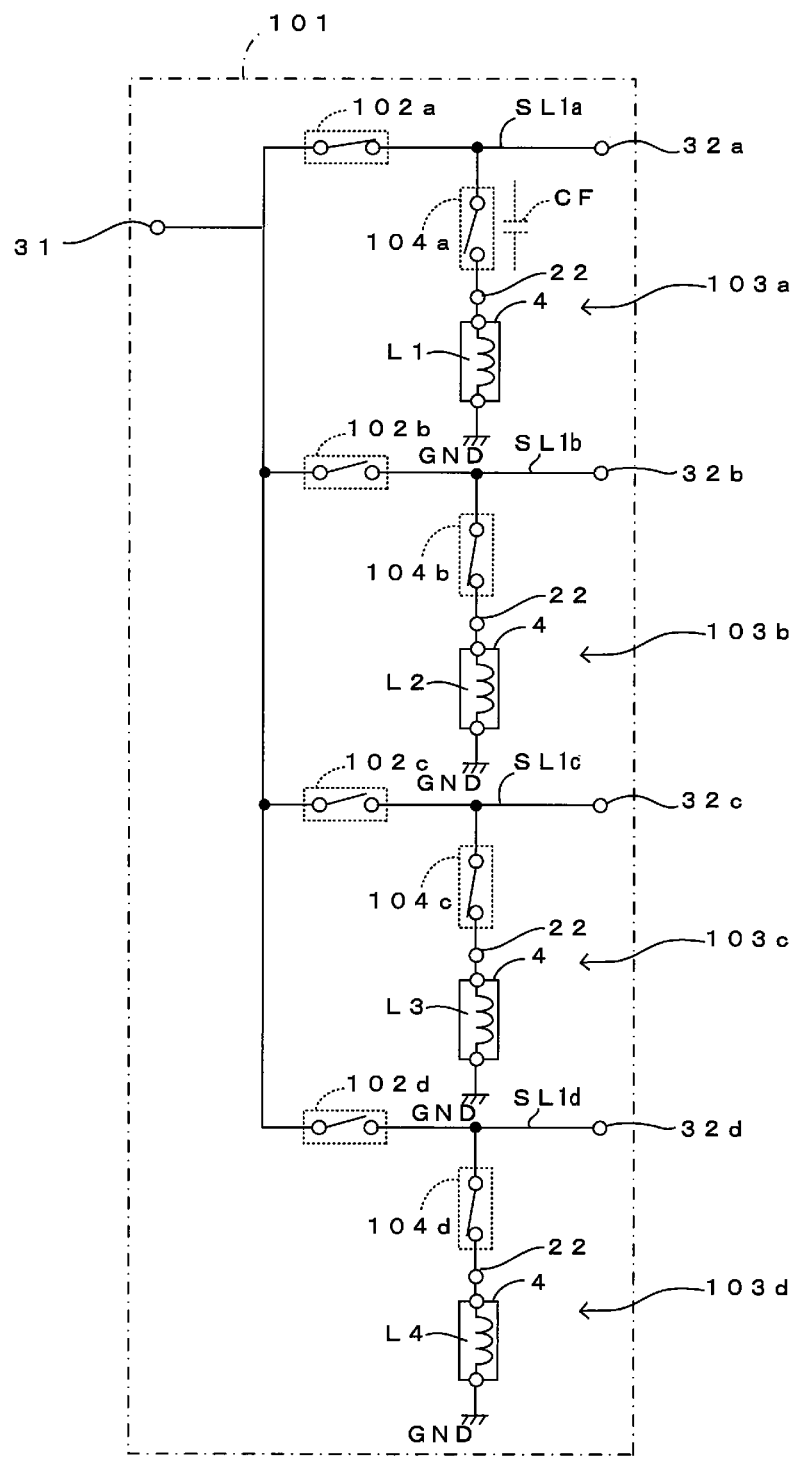
FIG. 3 is a diagram illustrating a switching circuit included in the high frequency circuit in FIG. 2.

A first preferred embodiment of the present invention will be described with reference to FIGS. 1 to 4. FIGS. 1 to 3 illustrate only a main configuration according to a preferred embodiment of the present invention. To simplify the description, the other configurations are not illustrated. Similarly to FIGS. 1 to 3, FIGS. 6 and 7 referred to in the description below also illustrate only a main configuration, and will not be described in the description thereof below.

A high frequency module 1 illustrated in FIGS. 1 and 2 is preferably mounted in a communication device (not illustrated) such as a cellular phone supporting the multi-mode and multi-bands in which multiple frequency bands are used to perform communication. Such a communication device supports multiple communication systems, such as the GSM standard, the W-CDMA standard, the LTE standard, and the Bluetooth standard. The high frequency module 1 includes a switching circuit that couples, through switching, an antenna A1 included in the communication device to multiple communication systems (not illustrated) used by the communication device.

The high frequency module 1 includes a multi-layer substrate 2 in which multiple (for example, five) insulating layers 2a to 2f are laminated, a switch IC 3 including a switching circuit 101, and circuit elements, such as inductors L1 to L4 and capacitors, which are preferably chip components 4 or wiring electrodes 5 provided in the multi-layer substrate 2.

The multi-layer substrate 2 preferably is a typical multi-layer substrate, such as an LTCC (low temperature co-fired ceramics) multi-layer substrate or a resin multi-layer substrate including a glass epoxy resin or the like. For example, the switch IC 3 and the chip components 4 to define matching circuits, various filter circuits, and the like are mounted on land electrodes 22 that are used to mount components and that are provided on a mounting surface 21 which is a first principal surface of the multi-layer substrate 2. The components and multiple external connecting terminals 24 which are provided on a second principal surface 23 of the multi-layer substrate 2 are electrically coupled to one another through the wiring electrode 5 included in the multi-layer substrate 2. The wiring electrodes 5 include in-plane conductors provided on the principal surfaces of the insulating layers, and via conductors connecting the in-plane conductors provided on the insulating layers. The electrodes, such as the land electrodes 22, the external connecting terminals 24, and the wiring electrodes 5, are preferably made of a conductive material containing Cu, Ag, or the like.

As illustrated in FIG. 2, the switch IC 3 includes a common terminal 31 (corresponding to a "first terminal") coupled through a wiring electrode 5 to a common electrode ANT1a (external connecting terminal 24) provided on the multi-layer substrate 2, and multiple (in this preferred embodiment, four, for example) switching terminals 32a to 32d (corresponding to "second terminals"). The antenna A1 is coupled to the common electrode ANT1a. The switching terminals 32a to 32d support signals of different respective communication systems (not illustrated). To pass a signal of a desired communication system, the switch IC 3 couples, through switching, any of the switching terminals 32a to 32d to the common terminal 31. The configuration of the switching circuit 101 will be described in detail.

As illustrated in FIG. 3, the switching circuit 101 includes multiple (in this preferred embodiment, four, for example) first switching devices 102a to 102d and multiple (in this preferred embodiment, four, for example) shunt circuits 103a to 103d. Each of the first switching devices 102a to 102d is coupled to the common terminal 31 at one end, and is coupled to a corresponding one of the switching terminals 32a to 32d at the other end. Thus, four signal paths SL1a to SL1d that couple the common terminal 31 to the respective switching terminals 32a to 32d are provided. Between each of the switching terminals 32a to 32d and a ground terminal (ground GND) included in the high frequency module 1, a corresponding one of the shunt circuits 103a to 103d is provided.

As illustrated in FIG. 3, each of the shunt circuits 103a to 103d includes a series circuit including a corresponding one of second switching devices 104a to 104d and a corresponding one of the inductors L1 to L4. Each of the second switching devices 104a to 104d is coupled, at one end, to a corresponding one of the switching terminals 32a to 32d (signal paths SL1a to SL1d). Each of the inductors L1 to L4 is coupled, at one end, to the other end of a corresponding one of the second switching devices 104a to 104d, and is coupled to the ground terminal (ground GND) at the other end. In this preferred embodiment, the second switching devices 104a to 104d are coupled through the land electrodes 22 to the inductors L1 to L4 that are chip components 4.

In this preferred embodiment, the first switching devices 102a to 102d and the second switching devices 104a to 104d are preferably field-effect transistors (FETs), for example. The FETs are provided on a semiconductor substrate as an integral unit so that the switch IC 3 is provided. The inductors of the shunt circuits may be mounted in the switch IC 3, or, as illustrated in FIG. 1, may be provided as chip components 4 on the multi-layer substrate 2 in such a manner as to be coupled to the switch IC 3 by using wiring electrodes 5 in the multi-layer substrate 2.

Figure 8:
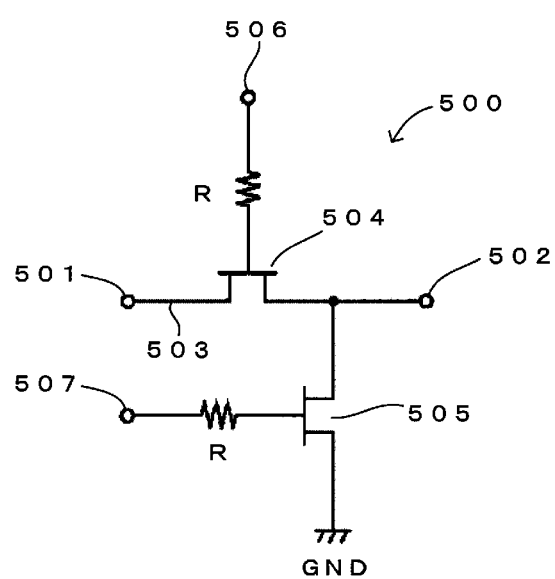
FIG. 8 is a diagram illustrating a switching circuit included in a high frequency module of the related art.

When a desired communication system is to be used, one of the first switching devices 102a to 102d is switched to the on state (in FIG. 3, the first switching device 102a is in the on state). Thus, the common terminal 31 is coupled to one of the switching terminals 32a to 32d through switching. As illustrated in FIG. 3, similarly to the switching circuit 500 of the related art described by referring to FIG. 8, when the first switching device 102a is switched to the on state, the second switching device 104a is switched to the off state. When the first switching devices 102b to 102d are switched to the off state, the second switching devices 104b to 104d are switched to the on state.

Figure 4:
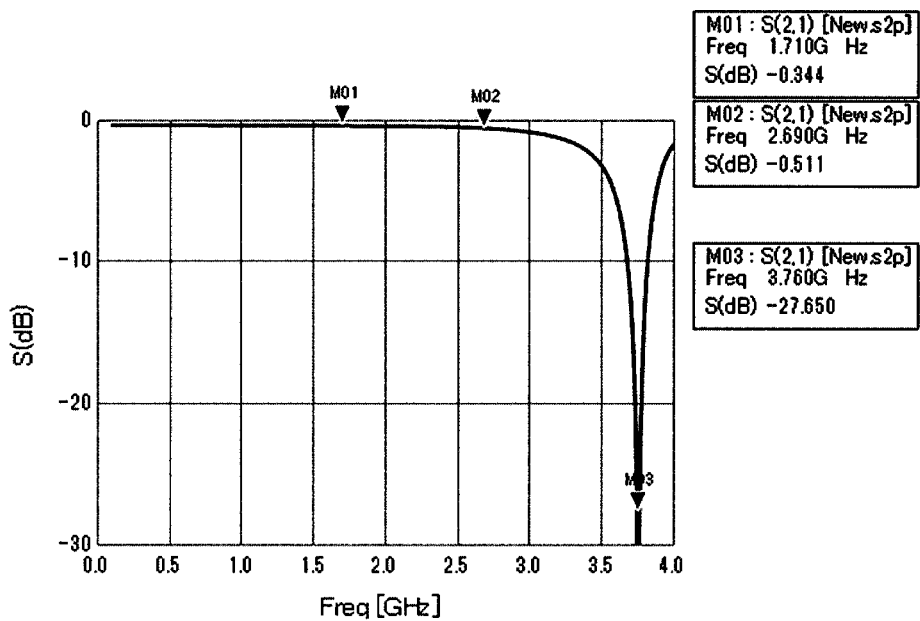
FIG. 4 is a diagram illustrating bandpass characteristics of the switching circuit in FIG. 3.
Figure 5:
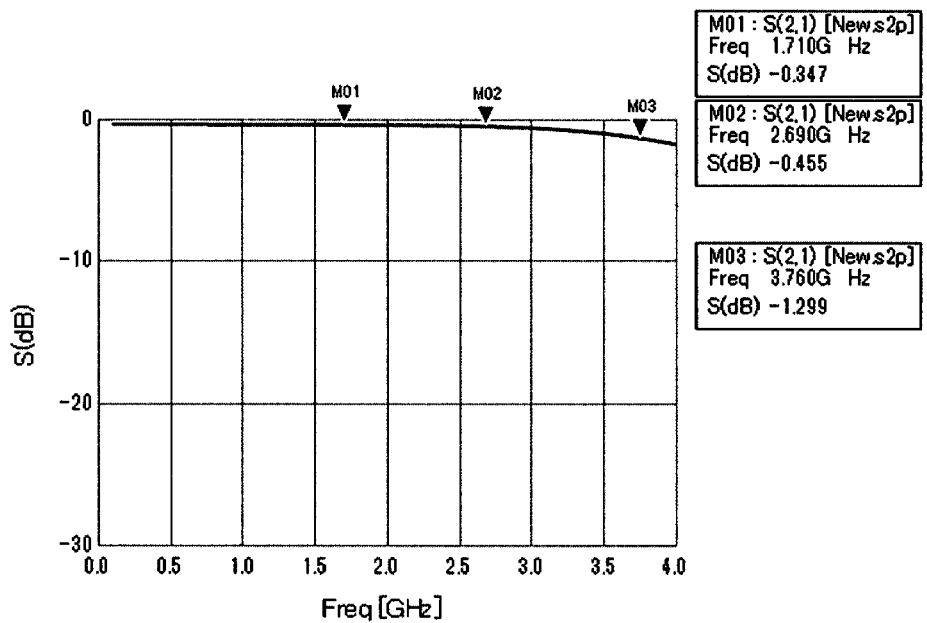
FIG. 5 is a diagram illustrating bandpass characteristics of a switching circuit of the related art.

Referring to FIGS. 4 and 5, improvement of isolation characteristics among the switching terminals 32a to 32d (signal paths SL1a to SL1d) of the switching circuit 101 including the inductors L1 to L4 will be described. An example will be described under the assumption that the off capacitance Cf of the second switching device 104a is about 0.1 pF and that the inductance of the inductor L1 is set to 18 nH, for example. The horizontal axes in FIGS. 4 and 5 represent frequency (GHz), and the vertical axes represent bandpass characteristics (dB: signal level). FIG. 4 illustrates the signal level of a signal observed at the switching terminal 32a in the case where the first switching device 102a is in the on state when the common terminal 31 receives a high frequency signal. An exemplary case in which the first switching device 102a is in the on state will be described. However, when one of the first switching devices 102b to 102d is in the on state, an effect similar to an effect described below may also occur. Therefore, the description will not be made.

As illustrated in FIG. 3, when the first switching device 102a is in the on state, the off capacitance Cf of the second switching device 104a illustrated in FIG. 3 and the inductor L1 define an LC series resonance circuit so that, as illustrated in FIG. 4, an attenuation pole is provided in the bandpass characteristics between the common terminal 31 and the switching terminal 32a. The inductance of the inductor L1 is designed so that the frequency of the attenuation pole is equal to or close to the frequency of an unnecessary high frequency signal. Thus, especially when an unnecessary high frequency signal in a frequency band around the frequency band in which the attenuation pole is located is propagated to the signal path SL1a (switching terminal 32a) from the other signal paths SL1b to SL1d (switching terminals 32b to 32d), the unnecessary high frequency signal that has been propagated through the shunt circuit 103a may be directed to the ground terminal (ground GND). Thus, the isolation characteristics in the switching circuit 101 are improved.

As described above, in the present preferred embodiment, the off capacitance of the second switching device 104a that is in the off state when the first switching device 102a is in the on state is used to attenuate an unnecessary signal, improving the isolation characteristics of the switching circuit 101.

The inductors L1 to L4 of the shunt circuits 103a to 103d may have inductances different from one another. In this case, LC series resonance circuits to which resonant frequencies different from one another are set are provided in the shunt circuits 103a to 103d. Therefore, the frequency band of a signal to be attenuated may be set for each of the signal paths SL1a to SL1d.

The inductors L1 to L4 are provided for the multi-layer substrate 2. Therefore, it is not necessary to mount inductors in the switch IC 3, resulting in reduction of the switch IC 3 in size. In addition, the inductances of the inductors L1 to L4 may be easily adjusted just by replacing chip components, achieving a wider range of choices in design of the switching circuit 101.

Second Preferred Embodiment

Figure 6:
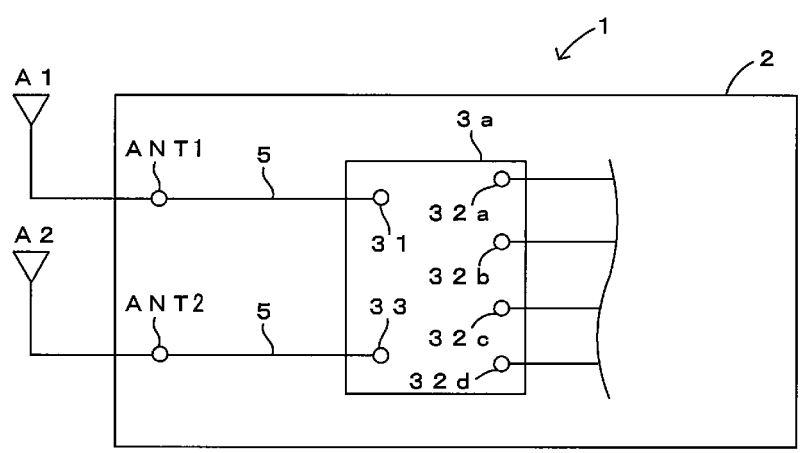
FIG. 6 is a diagram illustrating a high frequency circuit included in a high frequency module according to a second preferred embodiment of the present invention.
Figure 7:
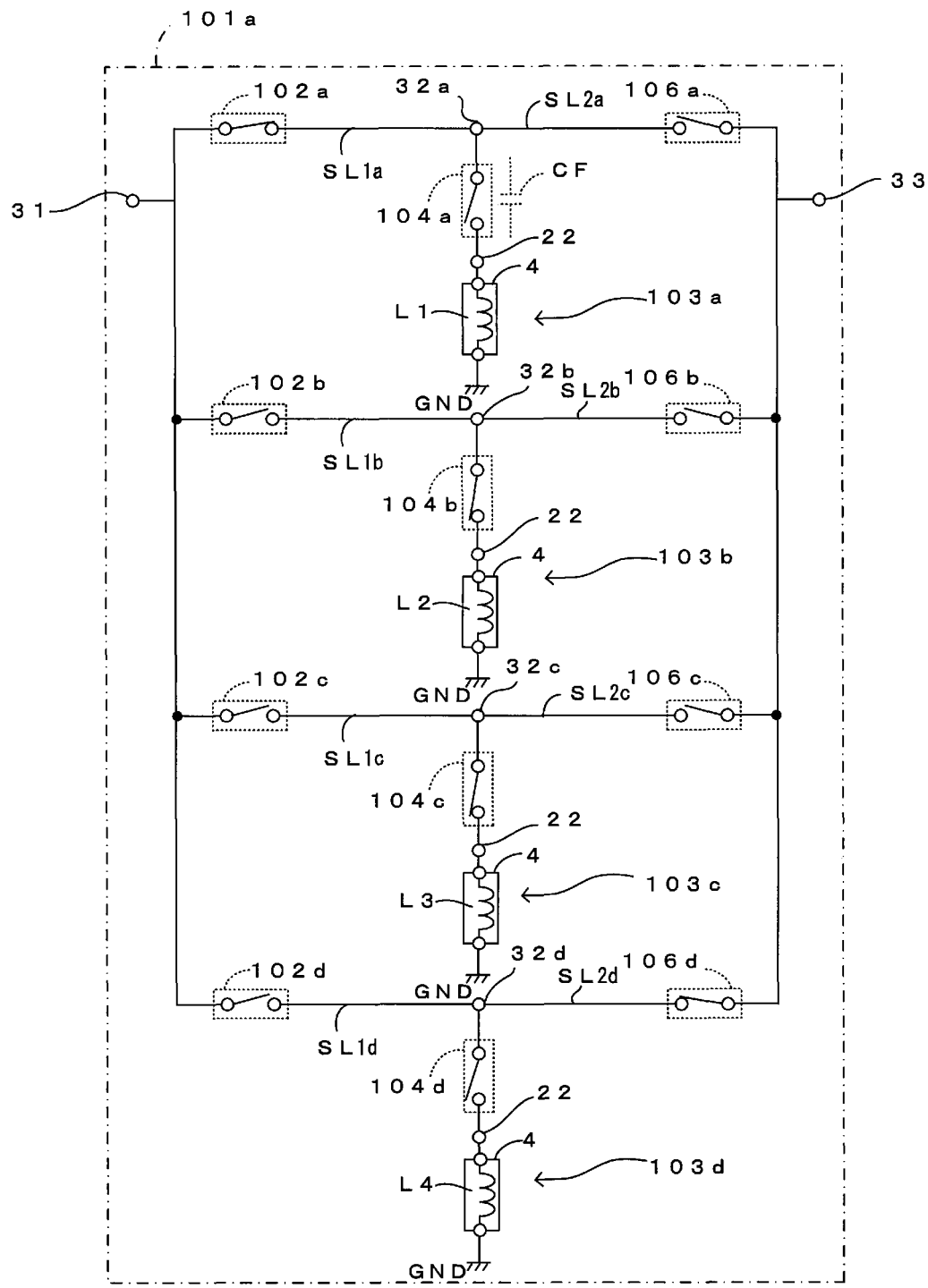
FIG. 7 is a diagram illustrating a switching circuit included in the high frequency circuit in FIG. 6.

Referring to FIGS. 6 and 7, a second preferred embodiment of the present invention will be described. The high frequency module 1 according to this preferred embodiment is different from that according to the first preferred embodiment described above in that, as illustrated in FIG. 6, a common terminal 33 (corresponding to a "third terminal" of the present invention) coupled to an antenna A2 is further included in a switch IC 3a. In the description below, points different from those in the first preferred embodiment will be mainly described. The other configurations and operations are similar to those in the first preferred embodiment described above, and are designated with identical reference characters. Thus, the other configurations and operations will not be described.

As illustrated in FIG. 6, the switch IC 3a includes the common terminal 31 coupled to a common electrode ANT1 (external connecting terminal 24) through a wiring electrode 5, the common terminal 33 coupled to a common electrode ANT2 (external connecting terminal 24) through a wiring electrode 5, and the multiple switching terminals 32a to 32d. The antenna A1 is coupled to the common electrode ANT1, and the antenna A2 is coupled to the common electrode ANT2. The switch IC 3 couples one of the common terminals 31 and 33 to one of the switching terminals 32a to 32d through switching. The configuration of a switching circuit 101a will be described in detail.

As illustrated in FIG. 7, the switching circuit 101a is structured so that the switching circuit 101 in FIG. 3 further includes multiple (in this preferred embodiment, four, for example) third switching devices 106a to 106d. Each of the third switching devices 106a to 106d is coupled to the common terminal at one end, and is coupled to a corresponding one of the switching terminals 32a to 32d at the other end. Thus, each of the third switching devices 106a to 106d is connected in series to a corresponding one of four signal paths SL2a to SL2d that couple the common terminal 33 to the respective switching terminals 32a to 32d. In the present preferred embodiment in FIG. 7, the common terminal 31 is coupled to the switching terminal 32a, and the common terminal 33 is coupled to the switching terminal 32d.

Similarly to the first switching devices 102a to 102d and the second switching devices 104a to 104d, the third switching devices 106a to 106d preferably are field-effect transistors (FETs), and include the first and second switching devices as an integral unit on a semiconductor substrate, thus defining the switch IC 3. The inductors of the shunt circuits may be mounted in the switch IC 3, or may be provided as chip components 4 on the multi-layer substrate 2 as illustrated in FIG. 1 so as to couple to the switch IC 3 by using wiring electrodes 5 in the multi-layer substrate 2.

One of the first switching devices 102a to 102d is switched to the on state (in FIG. 7, the first switching device 102a is in the on state). Thus, the common terminal 31 is coupled to one of the switching terminals 32a to 32d through switching. A signal of a desired communication system may be passed between the switching terminal and the common terminal 31. One of the third switching devices 106a to 106d is switched to the on state (in FIG. 7, the third switching device 106d is in the on state). Thus, the common terminal 33 is coupled to one of the switching terminals 32a to 32d through switching. A signal of a desired communication system may be passed between the switching terminal and the common terminal 33.

As illustrated in FIG. 7, similarly to the first preferred embodiment described above, when the first switching device 102a and the third switching device 106d are switched to the on state, the second switching devices 104a and 104d are switched to the off state. When the first switching devices 102b and 102c and the third switching devices 106b and 106c are switched to the off state, the second switching devices 104b and 104c are switched to the on state. That is, for each of the switching terminals 32a to 32d, in the case where one of a corresponding one of the first switching devices 102a to 102d and a corresponding one of the third switching devices 106a to 106d coupled to the switching terminal is switched to the on state, the second switching device coupled to the switching terminal coupled to the switching device that is in the on state is switched to the off state. In contrast, for each of the switching terminals 32a to 32d, in the case where both of a corresponding one of the first switching devices 102a to 102d and a corresponding one of the third switching devices 106a to 106d connected to the switching terminal are switched to the off state, the second switching device coupled to the switching terminal coupled to the first and third switching devices that are in the off state is switched to the on state.

Both of a corresponding one of the first switching devices 102a to 102d and a corresponding one of third switching devices 106a to 106d coupled to each of the switching terminals 32a to 32d are not switched to the on state. That is, the on/off state of each of the first switching devices 102a to 102d and the third switching devices 106a to 106d is controlled so that the communication system coupled to each of the switching terminals 32a to 32d is not coupled to the antennas A1 and A2 at the same time.

As described above, in this preferred embodiment, the inductances of the inductors L1 to L4 of the shunt circuit 103a are adequately set. Thus, desired attenuation poles are provided in the bandpass characteristics of each of the signal paths SL1a to SL1d coupling the common terminal 31 to the switching terminals 32a to 32d and the bandpass characteristics of each of the signal paths SL2a to SL2d coupling the common terminal 33 to the switching terminals 32a to 32d. Accordingly, similarly to the first preferred embodiment described above, the isolation characteristics among the switching terminals 32a to 32d (signal paths SL1a to SL1d, SL2a to SL2d) in the switching circuit 101a are improved.

The present invention is not limited to the preferred embodiments described above. Without departing from the gist, in addition to the above-described preferred embodiments, various changes may be made, and the configurations described above may be combined with each other in any manner. For example, the number of the switching terminals 32a to 32d, the number of the first switching devices 102a to 102d, and the number of the third switching devices 106a to 106d are not limited to the numbers described above. In accordance with the number of the communication systems handled by the communication device and the number of antennas A1 and A2, a necessary number of circuit elements such as switching devices may be included. In addition, a switching terminal that is not coupled to a shunt circuit may be further included. Further, a pair of first and second terminals may define a switching circuit. In this case, any of the first and second terminals may be coupled to an antenna.

In the above-described preferred embodiments, the switching devices 102a to 102d, 104a to 104d, and 106a to 106d may be field-effect transistors, for example. Alternatively, each of the switching devices 102a to 102d, 104a to 104d, and 106a to 106d may be a circuit including a PIN diode, or various switching devices, such as a bipolar transistor and an electrostatic induction transistor, for example.

An antenna coupled to the switch IC 3 or 3a is not limited to the multi-band antennas A1 and A2 described above, and may be multiple single-band antennas supporting the respective bands used in communication. In addition, the number of antennas coupled to a switch IC and the number of communication systems coupled to the switch IC may be appropriately set to adequate numbers in accordance with the configuration of a communication device in which the high frequency module 1 is mounted.

Preferred embodiments of the present invention may be widely applied to a switching circuit including a first switching device connected in series to a signal path and a second switching device shunt-connected to the signal path, and a high frequency module including the switching circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switching circuit comprising:
    a first terminal;
    a plurality of second terminals;
    a third terminal;
    a plurality of first switching devices, each of the plurality of first switching devices being connected to the first terminal and connected in series to a corresponding one of a plurality of first signal paths coupling the first terminal to a corresponding one of the plurality of second terminals, and each of the plurality of first signal paths being connected to a corresponding one of the plurality of second terminals;
    a plurality of shunt circuits, each of the plurality of shunt circuits being connected between a corresponding one of the plurality of second terminals and a ground terminal; and
    a plurality of third switching devices, each of the plurality of third switching devices being connected to the third terminal and connected in series to a corresponding one of a plurality of second signal paths coupling the third terminal to a corresponding one of the plurality of second terminals, and each of the plurality of second signal paths being connected to a corresponding one of the plurality of second terminals; wherein
    each of the shunt circuits includes a second switching device and an inductor, the second switching device and the inductor being coupled to each other in series;
    the inductors of the shunt circuits have inductances different from one another; and
    the first terminal is to be connected to a first antenna and the third terminal is to be connected to a second antenna.

2. The switching circuit according to claim 1, wherein each of the shunt circuits defines a series resonance circuit including a capacitance and the inductor, the capacitance being produced when the second switching device is in an off state, and the inductor of the series resonance circuit has an inductance value such that a resonant frequency of the series resonance circuit is equal or substantially equal to a frequency of a signal passing through one of the signal paths, the one of the signal paths being coupled to a different shunt circuit of the shunt circuits, the different shunt circuit being a shunt circuit in which the second switching device is in an on state.

3. The switching circuit according to claim 1, wherein each of the first switching devices and the second switches devices is one of a field-effect transistor, a circuit including a PIN diode, a bipolar transistor, and an electrostatic induction transistor.

4. The switching circuit according to claim 1, wherein each of the third switching devices is one of a field-effect transistor, a circuit including a PIN diode, a bipolar transistor, and an electrostatic induction transistor.

5. The switching circuit according to claim 1, wherein at least one of the inductors is a chip component.

6. A high frequency module comprising:
    a switching circuit that includes:
        a first terminal;
        a plurality of second terminals;
        a third terminal;
        a plurality of first switching devices, each of the plurality of first switching devices being connected to the first terminal and connected in series to a corresponding one of a plurality of first signal paths coupling the first terminal to a corresponding one of the plurality of second terminals, and each of the plurality of first signal paths being connected to a corresponding one of the plurality of second terminals;
        a plurality of shunt circuits, each of the plurality of shunt circuits being disposed connected between a corresponding one of the plurality of second terminals and a ground terminal; and
        a plurality of third switching devices, each of the plurality of third switching devices being connected to the third terminal and connected in series to a corresponding one of a plurality of second signal paths coupling the third terminal to a corresponding one of the plurality of second terminals, and each of the plurality of second signal paths being connected to a corresponding one of the plurality of second terminals; wherein
        each of the shunt circuits includes a second switching device and an inductor, the second switching device and the inductor being coupled to each other in series;
        the inductors of the shunt circuits have inductances different from one another; and
        the first terminal is to be connected to a first antenna and the third terminal is to be connected to a second antenna; and
    a multi-layer substrate including a first principal surface on which the first, second, and third switching devices are mounted.

7. The high frequency module according to claim 6, wherein at least one of the inductors is a chip component mounted on the first principal surface of the multi-layer substrate or a wiring electrode in the multi-layer substrate.

8. The high frequency module according to claim 6, wherein each of the shunt circuits defines a series resonance circuit including a capacitance and the inductor, the capacitance being produced when the second switching device is in an off state, and the inductor of the series resonance circuit has an inductance value such that a resonant frequency of the series resonance circuit is equal or substantially equal to a frequency of a signal passing through one of the signal paths, the one of the signal paths being coupled to a different shunt circuit of the shunt circuits, the different shunt circuit being a shunt circuit in which the second switching device is in an on state.

9. The high frequency module according to claim 6, wherein each of the first switching devices and the second switches devices is one of a field-effect transistor, a circuit including a PIN diode, a bipolar transistor, and an electrostatic induction transistor.

10. The high frequency module according to claim 6, wherein each of the third switching devices is one of a field-effect transistor, a circuit including a PIN diode, a bipolar transistor, and an electrostatic induction transistor.

11. The high frequency module according to claim 6, wherein the switching circuit is a switch IC.

12. The high frequency module according to claim 11, further comprising a first antenna connected to the first terminal, and a second antenna connected to the third terminal.

13. The high frequency module according to claim 12, wherein the first and second antennas include multi-band antennas or multiple single-band antennas.

14. A communication device comprising:
a high frequency module that includes:
a switching circuit including:
a first terminal;
a plurality of second terminals;
a third terminal;
a plurality of first switching devices, each of the plurality of first switching devices being connected to the first terminal and connected in series to a corresponding one of a plurality of first signal paths coupling the first terminal to a corresponding one of the plurality of second terminals, and each of the plurality of first signal paths being connected to a corresponding one of the plurality of second terminals;
a plurality of shunt circuits, each of the plurality of shunt circuits being connected between a corresponding one of the plurality of second terminals and a ground terminal; and
a plurality of third switching devices, each of the plurality of third switching devices being connected to the third terminal and connected in series to a corresponding one of a plurality of second signal paths coupling the third terminal to a corresponding one of the plurality of second terminals, and each of the plurality of second signal paths being connected to a corresponding one of the plurality of second terminals; wherein
each of the shunt circuits includes a second switching device and an inductor, the second switching device and the inductor being coupled to each other in series;
the inductors of the shunt circuits have inductances different from one another; and
the first terminal is to be connected to a first antenna and the third terminal is to be connected to a second antenna; and
a multi-layer substrate including a first principal surface on which the first, second, and third switching devices are mounted.

15. The communication device according to claim 14, wherein the communication device performs communication in multiple frequency bands and supports multiple communication systems.

* * * * *